United States Patent [19]

Wong

[11] 4,171,240
[45] Oct. 16, 1979

[54] METHOD OF REMOVING A CURED EPOXY FROM A METAL SURFACE

[75] Inventor: Ching-Ping Wong, West Windsor Township, Mercer County, N.J.

[73] Assignee: Western Electric Company, Inc., New York, N.Y.

[21] Appl. No.: 900,367

[22] Filed: Apr. 26, 1978

[51] Int. Cl.² .............................................. B29C 17/08
[52] U.S. Cl. ..................................... 156/630; 156/633; 156/656; 156/668; 156/322; 156/330; 250/492 R
[58] Field of Search ............... 156/630, 633, 656, 668, 156/322, 330; 427/164, 307; 96/38.3; 264/345, 342 RE, 341; 250/492 R, 505

[56] References Cited

U.S. PATENT DOCUMENTS

| | | | |
|---|---|---|---|
| Re. 29,015 | 10/1976 | DeAngelo et al. | 427/54 |
| 3,411,965 | 11/1968 | Hobaica | 156/633 |
| 3,698,940 | 10/1972 | Mersereau et al. | 204/30 |
| 3,758,332 | 9/1973 | Dinella et al. | 427/307 |
| 3,772,056 | 11/1973 | Polichette et al. | 427/305 |
| 3,772,078 | 11/1973 | Polichette et al. | 427/304 |
| 3,808,028 | 4/1974 | Lando | 427/307 |
| 3,885,071 | 5/1975 | Blad et al. | 156/630 |
| 3,892,900 | 7/1975 | Shima et al. | 428/40 |
| 3,892,973 | 7/1975 | Coquin et al. | 250/505 |
| 3,907,621 | 9/1975 | Polichette et al. | 427/307 |
| 3,925,578 | 12/1975 | Polichette et al. | 427/304 |
| 3,930,963 | 1/1976 | Polichette et al. | 427/305 |
| 3,939,027 | 2/1976 | Ohya et al. | 156/322 |
| 3,988,256 | 10/1976 | Vandermy et al. | 252/171 |
| 4,037,111 | 7/1977 | Coquin et al. | 250/505 |
| 4,086,128 | 4/1978 | Sugio et al. | 156/668 |

OTHER PUBLICATIONS

Reed, "Etching of Epoxy Glass Circuit Board," IBM Technical Disclosure Bulletin, vol. 6, No. 8 (1/64) p. 82.

*Primary Examiner*—Jerome W. Massie
*Attorney, Agent, or Firm*—Joel F. Spivak

[57] ABSTRACT

A method of removing a cured epoxy from a surface is disclosed. The method comprises treating at least the epoxy with a suitable swelling agent to swell the epoxy. The swelled epoxy is then treated with an oxidizing agent to oxidize the swelled epoxy. The oxidized epoxy is then treated with an etchant comprising sulfuric acid to remove the epoxy from the surface.

10 Claims, No Drawings

METHOD OF REMOVING A CURED EPOXY FROM A METAL SURFACE

BACKGROUND OF THE INVENTION

1. Field of the Invention

This invention relates to a method of removing a fully cured epoxy from a surface and more particularly, to chemically stripping the epoxy from the surface.

2. Discussion of the Prior Art

In fabricating laminates of all sorts, epoxy adhesives are frequently employed to bond the laminae of the laminate together. Oftentimes, it is desirable at some subsequent time to remove the epoxy, typically fully cured, from at least one of the laminae surfaces. The removal of fully cured epoxies is extremely difficult, if not oftentimes impossible. Chemical strippers for epoxies are currently available commercially, but these strippers have proven to be inadequate as general stripping agents for most types of epoxies.

Epoxy surfaces have been rendered hydrophilic or amenable to adherent electroless metal deposition thereon by first swelling the epoxy surface followed by etching thereof. In this regard, reference is made to U.S. Pat. Nos. 3,698,940; 3,758,332 and 3,808,028 which reveal typical swellants and etchants for epoxy surfaces. While these swellants and etchants have been found to be quite suitable for rendering an epoxy surface hydrophilic and/or roughened and thus amenable to adhesive metallization thereon, it has been found that these combinations of swellants and etchants per se are not suitable for stripping a cured epoxy from a surface. It has been found that some of these solvents and etchants attack or react with the epoxy to a very slight and impractical extent, i.e., they don't stripping purposes.

A method of chemically stripping a cured epoxy from a surface is needed and is desired.

SUMMARY OF THE INVENTION

This invention relates to a method of removing a fully cured epoxy from a surface and more particularly, to chemically stripping the epoxy from the surface.

The method comprises treating at least the epoxy with a swelling agent to swell the epoxy. The swelled epoxy is oxidized with an oxidizing agent to oxidize the swelled epoxy. The oxidized epoxy is treated with an etchant comprising sulfuric acid to remove it from the surface.

DETAILED DESCRIPTION

The present invention is described primarily in terms of stripping a fully cured epoxy resin, comprising a diglycidyl ether of bisphenol A or a modification thereof, from a surface of a laminae. However, it will be understood that such description is exemplary only and is for purposes of exposition and not for purposes of limitation.

It will be readily appreciated that the inventive concept is equally applicable to chemically stripping any epoxy group (oxirane group) containing resin, whether used as an adhesive or not, which has been fully cured to a hard thermoset solid, i.e., transferred from a linear structure to a network crosslinked in three dimensions.

Epoxy resins are commonly employed as adhesives in fabricating laminates such as for example copper-clad dielectric laminates. Epoxy resins are those materials typically possessing more than one vicinal oxirane or epoxy group. These compounds may be saturated or unsaturated, aliphatic, cycloaliphatic, aromatic or heterocyclic and may be substituted, if desired, with non-interfering substituents such as chlorine, hydroxy groups and the like. The polyepoxides may be monomeric or polymeric. The epoxy group may be terminal or non-terminal. Typical epoxy resins are described in U.S. Pat. No. 4,065,316, incorporated hereinto by reference.

Preferred epoxy resins are the glycidyl polyesters of dihydric phenols, such as the diglycidyl ester of bisphenol A and the diglycidyl ester of bisphenol F and halogenated substituents thereof. Other preferred epoxy resins include polyepoxidized phenol or creosol novolac resin.

The selected epoxy resin is typically combined with a conventional curing agent, e.g., an amine, an acidic anhydride, etc., and applied to at least one surface of the laminae to be joined. Suitable curing agents, as well as epoxy resins, are revealed and discussed in part in *Epoxy Resins—Their Application and Technology*, H. Lee and K. Neville, McGraw Hill Book Company, Inc. (1957). The laminae are then typically heated at elevated temperatures and elevated pressures whereby the epoxy resin or compound is fully cured or hardened into a three-dimensional crosslinked structure which bonds the laminae together to form a laminate. By fully cured is meant that the epoxy groups originally present have been consumed during the curing and the degree of crosslinking provides optimum physical properties for the desired application. It is possible to remove a layer or a portion of a layer from the laminate. However, heretofore it has been very difficult to chemically strip the resultant fully cured epoxy compound from the surface of the individual layers or portions of the laminate.

In order to remove the fully cured epoxy compound from a surface, the cured epoxy deposited on the surface is exposed to a suitable swelling agent or penetrant for a period of time sufficient to swell regions of the epoxy deposit. Swelling is defined as penetrating the epoxy in depth, by the swelling agent, without true dissolution thereof, and opening up or expanding in a spatial sense, the crosslinking network of the cured epoxy. A suitable swelling agent or penetrant is any material which is capable of swelling the cured epoxy. A sufficient period of time is interdependent upon the swelling agent or penetrant employed, the temperature at which the epoxy is exposed to the penetrant and the thickness of the epoxy deposit. These are factors which are well known to those skilled in the art or are easily ascertainable in the light of the disclosure contained herein without an undue amount of experimentation.

Some suitable swelling agents or penetrants for fully cured epoxy resins are revealed in U.S. Pat. Nos. 3,698,940; 3,758,332 and 3,808,028, all of which are incorporated hereinto by reference. In particular, a suitable type of swellant is one having the formula

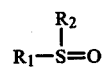

wherein $R_1$ is selected from the group consisting of hydrogen and alkyl of from 1 to 5 inclusive carbon atoms and $R_2$ is alkyl of from 1 to 5 inclusive carbon atoms. Typical of such compounds are methyl sulfoxide, dimethyl sulfoxide, diethyl sulfoxide, n-propyl sulfoxide, diisopropyl sulfoxide, methyl ethyl sulfoxide, methyl n-amyl sulfoxide, isopropyl n-amyl sulfoxide and di-n-amyl sulfoxide.

A second type of swellant is one having the formula

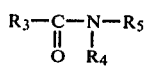

wherein $R_3$ is selected from the group consisting of hydrogen and alkyl of from 1 to 3 inclusive carbon atoms, $R_4$ is selected from the group consisting of hydrogen and alkyl of from 1 to 5 inclusive carbon atoms and $R_5$ is selected from the group consisting of hydrogen and alkyl of from 1 to 5 inclusive carbon atoms. Typical of such compounds are formamide, N,N-diethylformamide, N,N-diethylformamide, N,N-dimethyl acetamide, N-ethyl propionamide, N-n-propyl-N-amyl acetamide, N,N-di-n-butyl propionamide, N-ethyl-n-butyramide and N,N-diisopropyl-n-butyramide.

A third type of swellant is one having the formula

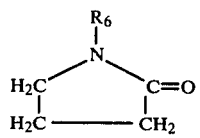

wherein $R_6$ is alkyl of from 1 to 5 inclusive carbon atoms. Typical of such compounds are N-methyl pyrrolidone, N-ethyl pyrrolidone, N-isopropyl pyrrolidone, N-n-butyl pyrrolidone, and N-isoamyl pyrrolidone.

Other suitable swellants include (1) a chlorinated aliphatic or aromatic hydrocarbon such as methylene chloride, 1,1,1-trichloroethane, chloroform and a chlorobenzene, (2) ketones such as methyl ethyl ketone, acetone, etc., (3) tetrahydrofuran, (4) dioxane, (5) pyridine, (6) an alcohol mixture comprising methyl ethyl ketone and denatured alcohol (95% ethanol and 5% methanol), and (7) a mixture of dimethylformamide and/or 1-methyl-2-pyrrolidinone combined with at least one of the following organic compounds: (a) ethylene glycol, (b) 4-hydroxy-4-methyl-2-pentanone, (c) formic acid, (d) 1,1,1-trichloroethane, (e) a mixture of methyl ethyl ketone and 1,1,2-trichloro-1,2,2-trifluoroethane and (f) a mixture of acetone and 1,1,2-trichloro-1,2,2-trifluoroethane.

It is of course to be understood that any solvent capable of swelling the fully cured epoxy can be employed. The only limitation thereon is that the solvent must be chemically compatible with the surface from which the epoxy is to be stripped.

Typically, the swelling exposure time to the above solvents ranges from 30 seconds to 15 minutes at 25° C. whereby a fully cured epoxy resin comprising a diglycidyl ester of bisphenol A having a thickness of 0.5 mil is sufficiently swelled. Again it is to be pointed out that the exposure time to a particular solvent is interdependent on temperature and the time period given above for a temperature at 25° C. is exemplary only and is not limiting. The time-temperature parameters are easily ascertained by one skilled in the art.

The swelled, fully cured epoxy may be rinsed with an inert solvent, e.g., water, and is next exposed to a suitable oxidizing agent for a period of time sufficient to oxidize the swelled, fully cured epoxy. Some suitable oxidizing agents include ferric chloride, persulfate salts, e.g., ammonium persulfate, permanganate salts, e.g., potassium permanganate, dichromates, e.g., potassium dichromate, etc. The oxidizing agent is usually employed in a solution, either aqueous or non-aqueous. The swelled epoxy is exposed to or heated with the oxidizing agent for a period of time sufficient to oxidize the swelled epoxy without deleteriously affecting the surface upon which the cured epoxy is deposited. Typically, the swelled epoxy is exposed to the above-described oxidizing agents for a period of 1 to 2 minutes at a temperature of 50° C., whereby the swelled epoxy is oxidized to the extent desired. In this regard, the time of oxidation and the temperature thereof are interdependent. This interdependency is one which is well known to those skilled in the art or is easily ascertained by one skilled in the art, in the light provided by the disclosure contained herein, without any undue amount of experimentation.

It is to be pointed out that the use of an oxidizing acid, such as chromic acid, does not ultimately lead to the chemical stripping of the cured epoxy deposit.

After the fully cured epoxy deposited surface has been exposed to the oxidizing agent and perhaps rinsed with an inert rinsing agent, e.g., water, to remove any excess oxidizing agent, the oxidized epoxy deposit is exposed to a suitable etchant for a period of time sufficient to remove the cured epoxy deposit from the surface. It has been found that only sulfuric acid is suitable to completely remove or strip the oxidized epoxy deposit. Other mineral acids such as nitric acid, hydrochloric acid, hydrofluoric acid and acids such as chromic acid, phosphoric acid and organic acids such as methane sulfonic acid, trifluoroacetic acid either do not work at all or if they do attack the oxidized epoxy, the reaction is exceedingly slow and incomplete.

The oxidized epoxy deposit is treated with sulfuric acid for a period of time sufficient to remove the cured epoxy deposit from the surface. Typically, such an exposure ranges from 7 seconds at 145° C. to 90 seconds at 49° C. for a 0.5 mil epoxy deposit of a fully cured diglycidyl ether of bisphenol A which has been adequately swelled and oxidized.

It is to be pointed out and stressed hereat that it is critical that the fully cured epoxy be first swelled, oxidized and then treated with sulfuric acid. If any of these steps are eliminated or transposed, then the fully cured epoxy deposit will not be completely chemically stripped.

The stripping method disclosed herein is very useful in preparing a mask for selectively transmitting therethrough a desired light radiant energy, described by Donald Dinella and Ching-Ping Wong in their patent application, Ser. No. 900,368, assigned to the assignee hereof and filed on April 26, 1978, and incorporated hereinto by reference. In particular, a base comprising a 5 to 10 mil thick film of a copolymer of tetrafluoroethylene and hexafluoropropylene ("TEFLON FEP," commercially obtained from E. I. DuPont de Nemours) is selected. The copolymer film is first heat treated, typically 80° to 200° C., for a period of time, e.g., 8 days at 185° C., sufficient to relax essentially all of the stresses within the film to render the film essentially dimensionally stable. A metal layer, e.g., a copper layer, is adhesively bonded to the heat treated film using conventional laminating procedures, e.g., high pressure and/or high temperature laminating techniques and an epoxy resin adhesive. The copper layer is selectively masked with a photoresist pattern and etched with a suitable etchant, e.g., $FeCl_3$, to delineate an etched pattern corresponding to the pattern of desired light radiant energy to be transmitted through the resultant mask. The etched pattern reveals exposed portions of the cured epoxy adhesive which had been underlying the etched and removed metal layer. The exposed portions of the fully cured epoxy are then removed using the swelling, oxidizing and sulfuric acid etching sequence described above to reveal a pattern in the laminate capable of transmitting a desired light radiant energy therethrough.

It is of course to be understood that a portion of the metal layer may be selectively removed by any conventional means, including but not limited to abrading and laser machining, etc., whereby an exposed pattern comprising the fully cured epoxy adhesive is obtained.

EXAMPLE I

A laminate comprising about a 1.4 mil thick copper layer, a 0.5 mil thick adhesive layer, comprising a modified epoxy resin, adhesively joining the copper layer to a base layer comprising a 5 mil thick copolymer film of tetrafluoroethylene and hexafluoropropylene ("TEFLON 100 FEP"), was commercially obtained from Circuit Materials Division of Oak Materials Group (designated as "CMC 1117 FEP TEFLON X COPPER LAMINATE"). Prior to the lamination, the copolymer film was heat treated at 185° C. for 8 days.

A commercially obtained photoresist material (obtained from E. I. DuPont de Nemours and Company and designated as "RISTON® 116S") was applied to the major surface of the copper layer and after storage in the dark for one-half to one hour was selectively exposed to an ultraviolet radiation source for 45 seconds. The exposed photoresist layer was then developed in 1,1,1-trichloroethylene at 25° C. for 75 seconds. The resultant photoresist-patterned laminate was rinsed with deionized water for 3 to 5 minutes at 25° C. and then dried with nitrogen gas. The dried, patterned laminate was then immersed in an etchant comprising 40 weight percent aqueous ferric chloride wherein the exposed portions of the copper layer were etched and removed from the laminate thereby exposing the modified epoxy adhesive layer thereat. The exposed modified epoxy adhesive layer was removed in the following manner. The resultant patterned laminate was immersed in methylene chloride swellant at 25° C. for 30 to 60 seconds (which removed any remaining photoresist), followed by immersion in 10 weight percent aqueous ammonium persulfate at 25° C. for 30 seconds followed by immersion in 98 weight percent aqueous $H_2SO_4$ at 145° C. for 7 seconds. The resultant laminate was then rinsed with deionized water for 2 minutes and dried with nitrogen gas. The exposed epoxy was thereby completely removed. Any photoresist remaining was removed by methylene chloride. A photomask suitable for selectively exposing a surface to a source of light radiant energy was thus obtained.

EXAMPLE II

The procedure of EXAMPLE I was repeated except that the laminate was exposed to the $H_2SO_4$ at 49° C. The exposed epoxy adhesive was completely removed in 90 seconds.

EXAMPLE III

The procedure of EXAMPLE I was repeated except that the laminate was exposed to the $H_2SO_4$ at 87.5° C. The exposed epoxy adhesive was completely removed in 30 seconds.

EXAMPLE IV

The procedure of EXAMPLE I was repeated except that the laminate was exposed to the $H_2SO_4$ at 107° C. The exposed epoxy adhesive was completely removed in 15 seconds.

EXAMPLE V

One hundred grams of a diglycidyl ether of bisphenol A having an epoxide equivalent weight of 875 to 975, a Gardner-Holdt viscosity at 40% nonvolatiles in Dowanol® DB at 25° C. of Q-U and a Durran's softening point of 95° to 105° C. (commercially obtained from Shell Chemical Company and designated as "EPON 1004"), was combined with 10 grams of triethylene tetramine curing agent. The mixture was applied to an aluminum surface and fully cured by heating at 150° C. for 30 minutes. A chemical stripping procedure of immersion in methylene chloride at 25° C. for 5 minutes, immersion in 10 weight percent aqueous ammonium persulfate at 25° C. for 5 minutes and then immersion in 98 weight percent aqueous $H_2SO_4$ at 70° C. for 5 minutes was carried out. The resultant fully cured epoxy deposit was completely removed from the aluminum surface.

EXAMPLE VI

For comparison purposes, the procedure of EXAMPLE V was repeated except that the fully cured epoxy deposit was treated only with the methylene chloride at 25° C. for 5 minutes. Five samples were so treated and in only one of the samples was the fully cured epoxy deposit partially removed within the 5 minute treatment period.

EXAMPLE VII

The procedure of EXAMPLE V was repeated except that the fully cured epoxy deposit was treated only with the $H_2SO_4$ at 70° C. for five minutes. Five samples were so treated and the epoxy deposits thereof were only delustered.

EXAMPLE VIII

The procedure of EXAMPLE V was repeated except that 100 grams of the epoxy resin were combined with 15.5 grams of 4,4-dimethylaniline curing agent and heated at 170° C. for one hour to attain a full cure. Essentially the same results as in EXAMPLE V were obtained.

EXAMPLE IX

The procedure of EXAMPLE V was repeated except that 100 grams of the epoxy resin were combined with 13 grams of nadic methyl anhydride and 50 grams of benzyl dimethyl amine curing agent mixture and heated at 170° C. for one hour to attain a full cure thereof. Essentially the same results as in EXAMPLE V were obtained.

EXAMPLE X

The procedure of EXAMPLE I was repeated except that instead of the methylene chloride swellant a swelling agent comprising methyl ethyl ketone was employed. The cured epoxy deposit was exposed to the methyl ethyl ketone for 3 minutes at 60° C. followed by exposure to the 10 weight percent aqueous ammonium persulfate at 50° C. for 2 minutes and the 98 weight percent aqueous $H_2SO_4$ at 70° C. for 5 minutes. Complete removal of the cured epoxy from the copolymer surface was obtained.

EXAMPLE XI

The procedure of EXAMPLE X was repeated except that instead of methyl ethyl ketone a swelling agent comprising tetrahydrofuran was employed. The cured epoxy deposit was exposed to the tetrahydrofuran for 3 minutes at 60° C. followed by exposure to the ammonium persulfate at 50° C. for 2 minutes and the $H_2SO_4$ at 70° C. for 5 minutes. Complete removal of the cured epoxy from the copolymer surface was obtained.

EXAMPLE XII

The procedure of EXAMPLE X was repeated except that instead of methyl ethyl ketone a swelling agent comprising dimethylformamide was employed. The cured epoxy deposit was exposed to the dimethylformamide for 3 minutes at 60° C. followed by exposure to the ammonium persulfate and the $H_2SO_4$. Complete removal of the cured epoxy from the copolymer surface was obtained.

EXAMPLE XIII

The procedure of EXAMPLE X was repeated except that instead of methyl ethyl ketone a swelling agent comprising pyridine was employed. The cured epoxy deposit was exposed to the pyridine for 3 minutes at 60° C. followed by exposure to the ammonium persulfate and the $H_2SO_4$. Complete removal of the cured epoxy from the copolymer surface was obtained.

EXAMPLE XIV

The procedure of EXAMPLE X was repeated except that instead of methyl ethyl ketone 50 volume percent aqueous ethanol was employed as the swelling agent. Exposure at 60° C. for 3 minutes to the ethanol and to the ammonium persulfate and the $H_2SO_4$ did not lead to removal of the cured epoxy deposit.

EXAMPLE XV

The procedure of EXAMPLE XIV was repeated except that 50 volume percent aqueous methanol was used as the swellant. The cured epoxy deposit was not removed.

EXAMPLE XVI

The procedure of EXAMPLE I was repeated except that instead of ammonium persulfate, 30 weight percent aqueous $H_2O_2$ was employed as the oxidizing agent. The fully cured epoxy deposit was treated with the methylene chloride at 60° C. for 2 minutes, followed by treatment with the $H_2O_2$ at 50° C. for 2 minutes and then followed by treatment with the 98 weight percent aqueous $H_2SO_4$ at 70° C. for 5 minutes. Complete removal of the epoxy deposit was obtained.

EXAMPLE XVII

The procedure of EXAMPLE I was repeated except that 48 weight percent aqueous hydrofluoric acid was employed instead of the sulfuric acid. The swelled and oxidized epoxy deposit was treated with the hydrofluoric acid at 60° C. for 3 minutes with one sample and for 6 minutes with a second sample. The epoxy deposit was not removed.

EXAMPLE XVIII

The procedure of EXAMPLE XVII was repeated except that 85 weight percent aqueous phosphoric acid was employed at 60° C. for 3 minutes with one sample and for 6 minutes with a second sample. The epoxy deposit was not removed.

EXAMPLE XIX

The procedure of XVII was repeated except that methyl sulfonic acid was employed at 60° C. for 3 minutes with one sample and for 6 minutes with a second sample. The epoxy deposit was not removed.

EXAMPLE XX

The procedure of EXAMPLE XVII was repeated except that trifluoro acetic acid was employed at 60° C. for 3 minutes with one sample and for 6 minutes with a second sample. The epoxy deposit was not removed.

EXAMPLE XXI

The procedure of EXAMPLE XVII was repeated except that 20 weight percent aqueous chromic acid was employed at 50° C. for 3 minutes. The epoxy deposit was not removed.

EXAMPLE XXII

The procedure of EXAMPLE I was repeated except that the fully cured epoxy deposit was not swelled or oxidized but was only exposed to 98 weight percent aqueous $H_2SO_4$ at 50° C. for 3 minutes. The epoxy deposit was not removed but was delustered and cracked.

EXAMPLE XXIII

The procedure of EXAMPLE I was repeated except that the swelled epoxy was treated with 20 weight percent aqueous chromic acid for 2 minutes at 50° C. followed by treatment with the 98 weight percent aqueous $H_2SO_4$ at 50° C. for 3 minutes. The epoxy deposit was not removed.

It is to be understod that the above-described embodiments are simply illustrative of the principles of the invention. Various other modifications and changes may be made by those skilled in the art which will embody the principles of the invention and fall within the spirit and scope thereof.

What is claimed is:

1. A method of making a metal pattern of a metal which lies below hydrogen in the EMF series from a metal laminate which includes a cured epoxy, consisting the step of removing or stripping exposed portions of said epoxy from said laminate by:
   (1) treating said cured epoxy with a swellant to swell the epoxy,
   (2) oxidizing said swelled epoxy with an oxidizing agent to give a sulfuric acid etchable oxidation product, and subsequently
   (3) treating said oxidized epoxy with a sulfuric acid solution at a temperature of from about 50° C. to 145° C. and for a time so as to remove said oxidized epoxy from the surface without substantially attacking any exposed metal.

2. The method as defined in claim 1 wherein said swellant is selected from the group of swellants consisting of a swellant having the formula

wherein $R_1$ is selected from the group consisting of hydrogen and alkyl of from 1 to 5 inclusive carbon atoms and $R_2$ is alkyl of from 1 to 5 inclusive carbon atoms; a swellant having the formula

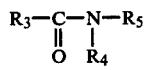

wherein $R_3$ is selected from the group consisting of hydrogen and alkyl of from 1 to 3 inclusive carbon atoms, $R_4$ is selected from the group consisting of hydrogen and alkyl of from 1 to 5 inclusive carbon atoms and $R_5$ is selected from the group consisting of hydrogen and alkyl of from 1 to 5 inclusive carbon atoms; a swellant having the formula

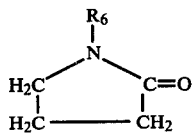

wherein $R_6$ is alkyl of from 1 to 5 inclusive carbon atoms; a chlorinated hydrocarbon; a ketone; tetrahydrofuran; dioxane; pyridine; an alcohol mixture comprising methyl ethyl ketone, ethyl alcohol and methyl alcohol; a mixture comprising 1-methyl-2-pyrrolidinone and an organic component selected from the group consisting of ethylene glycol, 4-hydroxy-4-methyl-2-pentanone and formic acid; a mixture of dimethylformamide and an organic component selected from the group consisting of ethylene glycol, 4-hydroxy-4-methyl-2-pentanone, formic acid, and 1,1,1-trichloroethane; a mixture comprising methyl ethyl ketone and 1,1,2-trichloro-1,2,2-trifluoroethane; a mixture comprising acetone and 1,1,2-trichloro-1,2,2-trifluoroethane; and mixtures thereof.

3. The method as defined in claim 1 wherein said oxidizing agent is selected from the group consisting of ferric chloride, a persulfate compound, a permanganate compound, a dichromate compound and a mixture of the foregoing.

4. The method as defined in claim 3 wherein said swellant is selected from the group consisting of methylene chloride, methyl ethyl ketone, tetrahydrofuran, dimethylformamide, pyridine and a mixture of any of the foregoing swellants.

5. A method of fabricating a mask for selectively transmitting therethrough a desired light radiant energy, which comprises:
(a) heat treating a base comprising a copolymer of tetrafluoroethylene and hexafluoropropylene for a period of time sufficient to render it essentially dimensionally stable, said base being capable of transmitting therethrough the desired radiant energy;
(b) bonding a blocking metal layer to said heat treated base by means of a fully cured epoxy adhesive said metal being resistant to dissolution by sulfuric acid;
(c) removing a portion of said blocking metal layer to delineate an exposed pattern comprising said cured epoxy;
(d) swelling said exposed cured epoxy pattern with a suitable swellant;
(e) oxidizing said swelled epoxy pattern with an oxidizing agent which gives an oxidation product which is etchable in sulfuric acid; and subsequently
(f) exposing said oxidized epoxy pattern to an etchant comprising sulfuric acid at a temperature of from about 50° C. to 145° C. and for such a time as to remove said oxidized epoxy from said heat treated base without substantially removing exposed metal to form the mask.

6. The method as defined in claim 5 wherein said metal comprises copper.

7. The method as defined in claim 5 wherein said copolymer base is 5 to 10 mils in thickness.

8. The method as defined in claim 5 wherein said swellant is selected from the group of swellants consisting of a swellant having the formula

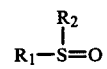

wherein $R_1$ is selected from the group consisting of hydrogen and alkyl of from 1 to 5 inclusive carbon atoms and $R_2$ is alkyl of from 1 to 5 inclusive carbon atoms; a swellant having the formula

wherein $R_3$ is selected from the group consisting of hydrogen and alkyl of from 1 to 3 inclusive carbon atoms, $R_4$ is selected from the group consisting of hydrogen and alkyl of from 1 to 5 inclusive carbon atoms and $R_5$ is selected from the group consisting of hydrogen and alkyl of from 1 1 to 5 inclusive carbon atoms; a swellant having the formula

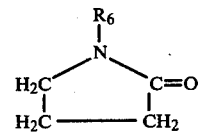

wherein $R_6$ is alkyl of from 1 to 5 inclusive carbon atoms; a chlorinated hydrocarbon; a ketone; tetrahydrofuran; dioxane; pyridine; an alcohol mixture comprising methyl ethyl ketone, ethyl alcohol and methyl alcohol; a mixture comprising 1-methyl-2-pyrrolidinone and an organic component selected from the group consisting of ethylene glycol, 4-hydroxy-4-methyl-2-pentanone and formic acid; a mixture of dimethylformamide and an organic component selected from the group consisting of ethylene glycol, 4-hydroxy-4-methyl-2-pentanone, formic acid, and 1,1,1-trichloroethane; a mixture comprising methyl ethyl ketone and 1,1,2-trichloro-1,2,2-trifluoroethane; a mixture comprising acetone and 1,1,2-trichloro-1,2,2-trifluoroethane; and mixtures thereof.

9. The method as defined in claim 5 wherein said oxidizing agent is selected from the group consisting of ferric chloride, a persulfate compound, a permanganate compound, a dichromate compound and a mixture of the foregoing.

10. The method as defined in claim 9 wherein said swellant is selected from the group consisting of methylene chloride, methyl ethyl ketone, tetrahydrofuran, dimethylformamide, pyridine and a mixture of any of the foregoing swellants.

* * * * *